(12) United States Patent
Kang et al.

(10) Patent No.: US 8,008,725 B2
(45) Date of Patent: Aug. 30, 2011

(54) FIELD TRANSISTORS FOR ELECTROSTATIC DISCHARGE PROTECTION AND METHODS FOR FABRICATING THE SAME

(75) Inventors: Taeg-hyun Kang, Incheon (KR); Jun-hyeong Ryu, Incheon (KR); Jong-hwan Kim, Bucheon (KR)

(73) Assignee: Fairchild Korea Semiconductor Ltd (KR)

( * ) Notice: Subject to any disclaimer, the term of this patent is extended or adjusted under 35 U.S.C. 154(b) by 1626 days.

(21) Appl. No.: 10/071,494

(22) Filed: Feb. 6, 2002

(65) Prior Publication Data

US 2002/0113269 A1   Aug. 22, 2002

(30) Foreign Application Priority Data

Feb. 20, 2001 (KR) .................................. 2001-8434

(51) Int. Cl.
  *H01L 27/088* (2006.01)
(52) U.S. Cl. .................. 257/360; 257/355; 257/E27.06
(58) Field of Classification Search .................. 257/360, 257/345, 336, 344, 408, 378, 370, 339, 341, 257/342, 413, 355, E27.06
  See application file for complete search history.

(56) References Cited

U.S. PATENT DOCUMENTS

| 3,789,503 | A | * | 2/1974 | Nishida et al. | ................ | 438/237 |
| 5,623,154 | A | * | 4/1997 | Murakami et al. | ............ | 257/345 |
| 6,359,318 | B1 | * | 3/2002 | Yamamoto et al. | ............ | 257/378 |
| 6,841,821 | B2 | * | 1/2005 | Hsu | ............................... | 257/305 |

FOREIGN PATENT DOCUMENTS

JP   4068575   3/1992

* cited by examiner

*Primary Examiner* — Victor Mandala

(74) *Attorney, Agent, or Firm* — Kirton & McConkie; Kenneth E. Horton

(57) ABSTRACT

A field transistor for electrostatic discharge (ESD) protection and method for making such a transistor is described. The field transistor includes a gate conductive layer pattern formed on a field oxide layer. Since the gate conductive layer pattern is formed on the field oxide layer, a thin gate insulating layer having a high possibility of insulation breakdown is not used. To form an inversion layer for providing a current path between source and drain regions, a field oxide layer is interposed to form low concentration source and drain regions overlapped by the gate conductive layer pattern.

23 Claims, 6 Drawing Sheets

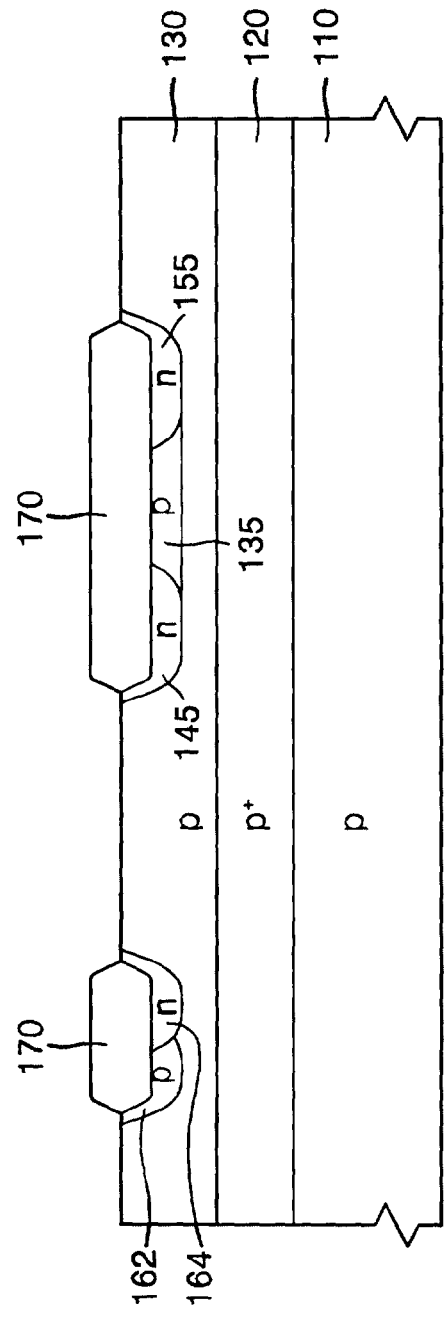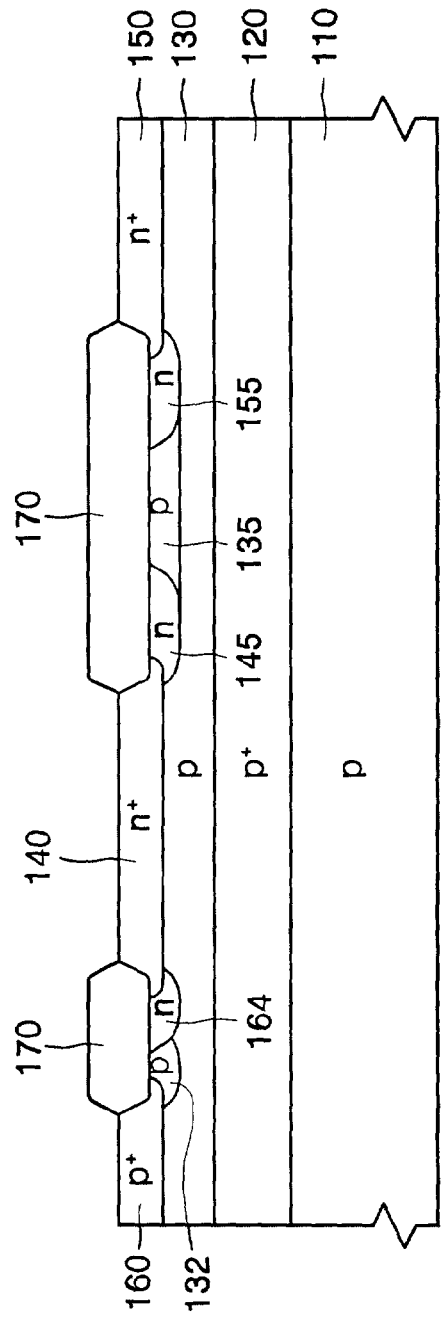

FIELD TRANSISTORS FOR ELECTROSTATIC DISCHARGE PROTECTION AND METHODS FOR FABRICATING THE SAME

FIELD OF THE INVENTION

The invention generally relates to semiconductor devices and methods for fabricating such devices. More particularly, the invention relates to field transistors for electrostatic discharge protection and methods for fabricating such transistors.

BACKGROUND OF THE INVENTION

To prevent damage to the entire device resulting from electrostatic discharge (ESD) stress, ESD protection circuits are typically coupled to input/output (I/O) terminals or bonding pads or the circuits are positioned in devices susceptible to ESD damage during normal operation of an integrated circuit (IC).

FIG. 1 illustrates a cross-section of a conventional field transistor used for ESD protection. As illustrated in FIG. 1, a $p^+$-type bottom region 12 and a p-type well region 13 are sequentially formed on a p-type substrate 11. The impurity concentration of the $p^+$-type bottom region 12 is higher than that of the p-type well region 13. An $n^+$-type source region 14 and an $n^+$-type drain region 15 are formed in the p-type well region 13 so that regions 14 and 15 are spaced apart from each other by a distance corresponding to a region for forming an inversion layer. A $p^+$-type diffusion region 16 is also formed in the p-type well region 13 so that it is spaced apart from the $n^+$-type source region 14 by a predetermined distance. The $p^+$-type diffusion region 16 is provided for applying bias to the p-type well region 13. A field oxide layer 17 is formed on the p-type well region 13 between the $p^+$-type diffusion region 16 and the $n^+$-type source region 14 and between the $n^+$-type source region 14 and the $n^+$-type drain region 15.

A patterned gate conductive layer 18 is formed on a gate insulating layer 19 and a field oxide layer 17. The gate conductive layer 18 is patterned to overlap parts of the $n^+$-type source region 14 and the $n^+$-type drain region 15 while overlapping all of field oxide layer 17. A gate electrode 20 is formed on the patterned gate conductive layer 18. A source electrode 21 is formed so as to contact the $n^+$-type source region 14 and the $p^+$-type diffusion region 16. A drain electrode 22, which contacts the $n^+$-type drain region 15, is connected to the gate electrode 20 in order to apply a turn-on voltage to the gate electrode 20 when ESD stress from the outside is generated through the drain electrode 22. Interlayer dielectric layer 23 is formed and patterned to electrically isolate each electrode.

In the conventional field transistor represented in FIG. 1, when ESD stress from the outside is generated through the drain electrode 22, a turn-on voltage is applied to the gate electrode 20 to form an inversion layer between the $n^+$-type source region 14 and $n^+$-type drain region 15. The inversion layer provides a complete current path between a drain terminal and a bulk. Thus, ESD current is routed to the bulk through the $n^+$-type drain region 15, the inversion layer, the $n^+$-type source region 14, and the $p^+$-type diffusion region 16, thereby protecting the devices against the ESD stress.

As depicted in FIG. 1, a gate insulating layer 19 is formed between each of the $n^+$-type source region 14 and the $n^+$-type drain region 15 and the gate insulating layer 18 and is significantly thinner than the field oxide layer 17. This smaller thickness increases the possibility of the breakdown of the gate insulating layer 19 due to the ESD stress, significantly reducing the reliability of the device. Such a problem may be solved in two ways. A first way is to make gate insulating layer 19 as thick as the field oxide layer 17. A second way is to form gate conductive layer 18 only on the field oxide layer 17.

The first method is unsatisfactory not only because the manufacturing cost is high, but also the manufacturing process is complicated because of the large number of process steps required by the addition of a mask. The second method is also unsatisfactory in that the $n^+$-type source region 14 and the $n^+$-type drain region 15 are not overlapped by the gate conductive layer 18. Thus, even if the inversion layer is formed between the $n^+$-type source region 14 and the $n^+$-type drain region 15, the inversion layer is not connected to the source region 14 and drain region 15 and does not providing a complete current path between both regions 14 and 15.

SUMMARY OF THE INVENTION

To solve the above problems, it is a first object of the invention to provide a field transistor for electrostatic discharge (ESD) protection that provides a complete current path between a source and a drain while not using a thin gate insulating layer that is vulnerable to ESD.

It is a second object of the present invention to provide a method of fabricating such a field transistor.

To achieve the first object, the invention provides a field transistor that includes: a well region of a first conductivity type; a field oxide layer for defining an active region on the well region; high concentration source and drain regions of a second conductivity type separated from each other by a width of the field oxide layer; a low concentration source region of the second conductivity type formed in the well region, the low concentration source region being adjacent to the high concentration source region and overlapped by one end of the field oxide layer; a low concentration drain region of the second conductivity type formed in the well region, the low concentration drain region being adjacent to the high concentration drain region and overlapped by the other end of the field oxide layer; and a gate conductive layer formed on the field oxide layer, the gate conductive layer overlapping parts of the low concentration source and drain regions of the second conductivity type.

In one aspect of the invention, the well region of the first conductivity type may be formed on a high concentration buried region of the first conductivity type on a semiconductor substrate of the first conductivity type. Alternatively, in another aspect of the invention, the well region of the first conductivity type may be formed on a semiconductor substrate of the second conductivity type.

In one aspect of the invention, the field transistor further includes a high concentration diffusion region of the first conductivity type formed in the well region, the high concentration diffusion region being separated from the high concentration source region of the second conductive type by a predetermined distance. In this aspect of the invention, the field transistor may further include a low concentration diffusion region of the first conductivity type and a low concentration diffusion region of the second conductivity type, both low concentration diffusion regions being adjacent to each other between the high concentration diffusion region of the first conductivity type and the high concentration source region of the second conductivity type. The low concentration diffusion region of the first conductivity type can be adjacent to the high concentration diffusion region of the first conductivity type, and the low concentration diffusion region of the second conductivity type can be adjacent to the high concentration source region of the second conductivity type.

In one aspect of the invention, the field transistor further includes: a gate electrode electrically connected to the gate conductive layer pattern; a source electrode electrically connected to the high concentration source region of the second conductivity type; and a drain electrode electrically connected to the high concentration drain region of the second conductivity type. The drain electrode can be electrically connected to the gate electrode and the source electrode can be electrically connected to the high concentration diffusion region of the first conductivity type as well.

To achieve the second object, the invention provides a method of fabricating a field transistor. The method includes: sequentially forming an oxide layer and a mask layer pattern on a well region of a first conductivity type; using the mask layer pattern as an ion implantation mask to implant impurity ions of the first conductivity type into the well region; forming a photoresist layer pattern on portions of the oxide layer and the mask layer pattern; using the exposed portion of the mask layer pattern and the photoresist layer pattern as an ion implantation mask to implant impurity ions of a second conductivity type into the well region; removing the photoresist layer pattern; forming a field oxide layer in which a portion of the oxide layer is grown using the mask layer pattern as an oxide growth prevention layer while diffusing the impurity ions of the first and second conductivity types to form low concentration source/drain regions of the second conductivity type; forming high concentration source/drain regions of the second conductivity type on either side of the field oxide layer in the well region; forming a high concentration diffusion region of the first conductivity type so that the high concentration diffusion region of the first conductivity type is separated from the high concentration source region of the second conductivity type by a predetermined distance; and forming a gate conductive layer pattern on the field oxide layer.

In one aspect of the invention, the photoresist layer pattern exposes the oxide layer corresponding to a portion of the well region into which the impurity ions of the first conductivity type are implanted. The implantation concentration of the impurity ions of the second conductivity type can be higher than that of the impurity ions of the first conductivity type. The gate conductive layer pattern can overlap the low concentration source/drain regions of the second conductivity type by interposing the field oxide layer therebetween.

In one aspect of the invention, the method further incldues: forming a gate electrode so that the gate electrode is electrically connected to the gate conductive layer pattern; forming a source electrode so that the source electrode is electrically connected to the high concentration source region of the second conductivity type; and forming a drain electrode so that the drain electrode is electrically connected to the high concentration drain region of the second conductivity type. The drain electrode can be electrically connected to the gate electrode and the source electrode can be electrically connected to the high concentration diffusion region of the first conductivity type.

BRIEF DESCRIPTION OF THE DRAWINGS

FIGS. 1-8 are views of semiconductor devices and methods for making such devices according to the invention, in which:

FIG. 1 illustrates a cross-section of a conventional field transistor for electrostatic discharge (ESD) protection;

FIG. 2 depicts a cross-section of one aspect of a field transistor for ESD protection according to the invention; and FIGS. 3-8 show cross-section views of various aspects of one method for fabricating a field transistor for ESD protection according to the invention.

FIGS. 1-8 presented in conjunction with this description are views of only particular—rather than complete—portions of semiconductor devices and methods for making such devices according to the invention.

DETAILED DESCRIPTION OF THE INVENTION

The following description provides specific details in order to provide a thorough understanding of the invention. The skilled artisan will understand, however, that the invention can be practiced without employing these specific details. Indeed, the invention can be practiced by modifying the illustrated devices and methods and can be used in conjunction with devices and methods conventionally used in the industry.

Figure 2:
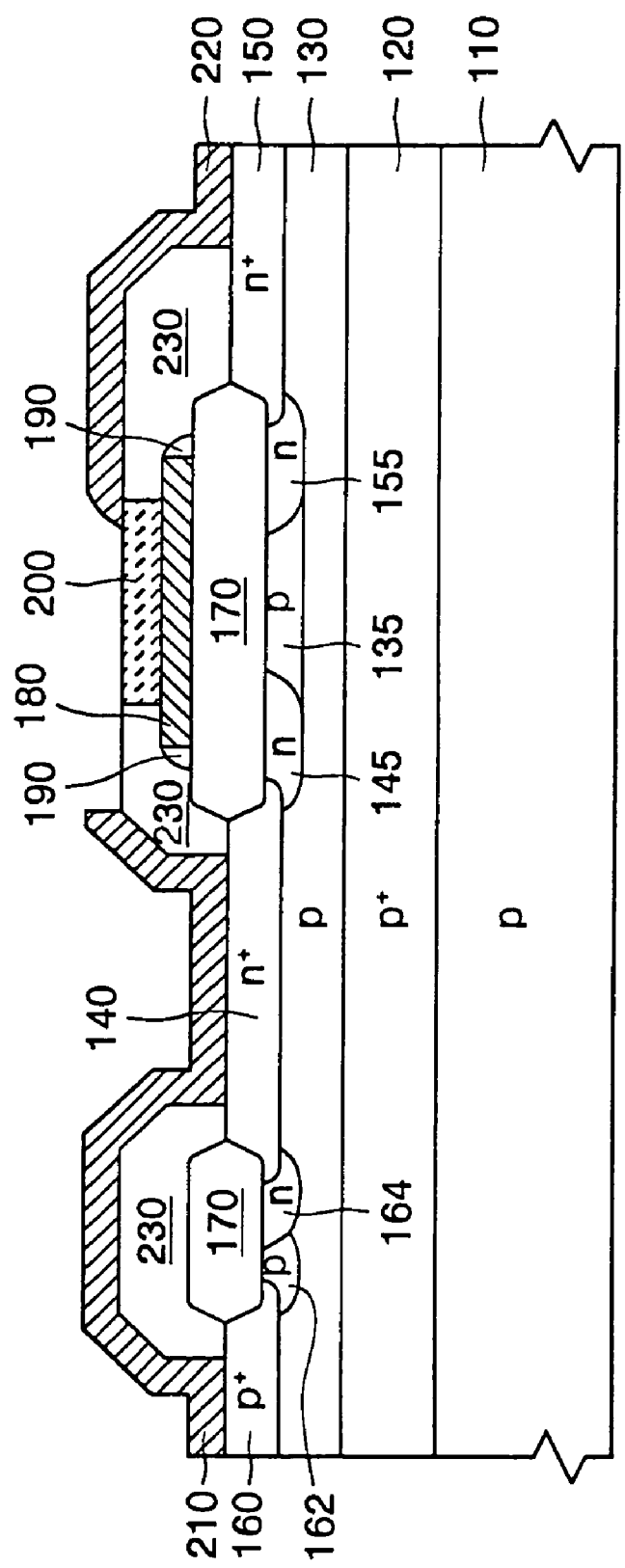

One aspect of the invention is illustrated in FIG. 2, where a $p^+$-type bottom region 120 and a p-type well region 130 are sequentially stacked on a p-type substrate 110. The impurity concentration of the $p^+$-type bottom region 120 is higher than those of the p-type substrate 110 and the p-type well region 130. The $p^+$-type bottom region 120 serves to increase current conduction efficiency in the field transistor, but in one aspect of the invention is not necessary. If the $p^+$-type bottom region 120 is not formed in the semiconductor devices of the invention, an n-type substrate is used in place of the p-type substrate 110 and the p-type well region 130 is formed in an upper region of the n-type substrate. The $n^+$-type source region 140 and the $n^+$-type drain region 150 are formed in the p-type well region 130 so they are separated from each other by a predetermined distance.

An n-type low concentration source region 145, a p-type region 135, and an n-type low concentration drain region 155 are formed between the $n^+$-type source region 140 and the $n^+$-type drain region 150 of the p-type well region 130. The impurity concentrations of the n-type low concentration source region 145 and the n-type low concentration drain region 155 are lower than those of the $n^+$-type source region 140 and the $n^+$-type drain region 150, respectively. The impurity concentration of the p-type region 135 is substantially the same as that of the p-type well region 130.

A $p^+$-type diffusion region 160 is separated from the $n^+$-type source region 140 by a predetermined distance and is formed in the p-type well region 130. The $p^+$-type diffusion region 160 is provided for applying bias to the p-type well region 130. A p-type diffusion region 162 and an n-type diffusion region 164 are formed between the $p^+$-type diffusion region 160 and the $n^+$-type source region 140. The $p^+$-type diffusion region 160 is adjacent to the p-type diffusion region 162, and the n-type diffusion region 164 is adjacent to the $n^+$-type source region 140. The p-type diffusion region 162 is formed adjacent to the n-type diffusion region 164. A field oxide layer 170 is formed between the $p^+$-type diffusion region 160 and the $n^+$-type source region 140, i.e., on the surfaces of the p-type diffusion region 162 and the n-type diffusion region 164. The field oxide layer 170 is formed between the $n^+$-type source region and the $n^+$-type drain region 150, i.e., on the surfaces of the n-type low concentration source region 145, the p-type region 135, and the n-type low concentration drain region 155.

The patterned gate conductive layer 180 is formed on the field oxide layer 170. While the gate conductive layer pattern 180 does not overlap the $n^+$-type source region 140 and the $n^+$-type drain region 150, the entire gate conductive layer pattern 180 overlaps the n-type low concentration source region 145, the p-type region 135, and the n-type low concentration drain region 155. A spacer 190 is formed along the sidewall of the gate conductive layer pattern 180. A gate electrode 200 is formed on the gate conductive layer pattern 180. A source electrode 210 is formed so that it contacts the n$^+$-type source region 140 and the p$^+$-type diffusion region 160. A drain electrode 220, which contacts the n$^+$-type drain region 150, is connected to the gate electrode 200 in order to apply a turn-on voltage to the gate electrode 200 when ESD stress from the outside is generated through the drain electrode 220. A patterned interlayer dielectric layer 230 for electrically isolating the electrodes from each another is also provided.

The field transistor according to the invention operates in the following manner. When ESD stress from outside of the device of the invention is generated through the drain electrode 220, a turn-on voltage is applied to the gate electrode 200 to form an inversion layer near the top of the p-type region 135. The formation of the inversion layer provides a complete current path between a drain terminal and a bulk. Thus, ESD current is routed to the bulk through the n$^+$-type drain region 150, the n-type low concentration drain region 155, the inversion layer in the p-type region 135, the n-type low concentration source region 145, the n$^+$-type source region 140, and the p$^+$-type diffusion region 160, thereby protecting against the ESD stress.

In the invention, a thin gate insulating layer does not exist in the field transistor. As well, the entire gate conductive layer 180 is formed on the relatively-thick field oxide layer 170. Thus, dielectric destruction of an insulating layer due to the ESD stress does not occur, greatly increasing the reliability of the device. In this aspect of the invention, the n$^+$-type source/drain regions 140 and 150 are not overlapped by the gate conductive layer 180. The n-type low concentration source region 145 and the n-type low concentration drain region 155 create a complete current path between the n$^+$-type source/drain regions 140 and 150. The n-type low concentration source region 145 is formed so that it is adjacent to the n$^+$-type source region 140 and is overlapped by the gate conductive layer pattern 180 with the field oxide layer 170 therebetween. The n-type low concentration drain region 155 is formed so that it is adjacent to the n$^+$-type drain region 150 and is overlapped by the gate conductive layer pattern 180 with the field oxide layer 170 therebetween. When the inversion layer is formed at the top of the p-type region, a complete current path is created.

Figure 3:
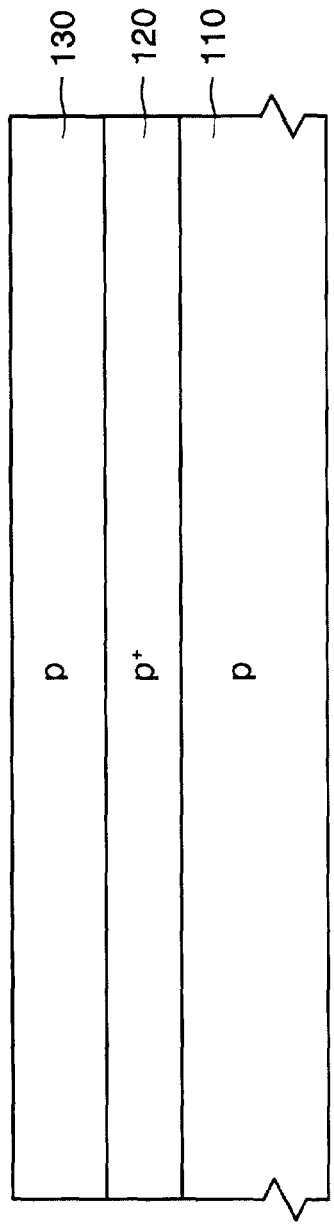

FIGS. 3-8 illustrate cross-sectional views of one aspect of a method of fabricating a field transistor for ESD protection according to the invention. As depicted in FIG. 3, a p$^+$-type bottom region 120 and a p-type well region 130 are sequentially formed on a p-type substrate 110. The impurity concentration of the p$^+$-type bottom region 120 is higher than those of the p-type substrate 110 and the p-type well region 130. The p$^+$-type bottom region 120 may be formed by ion implantation and the p-type well region 130 may be formed by epitaxial growth. However, the methods for forming the p$^+$-type bottom region 120 and the p-type well region 130 are not limited by these methods.

The p$^+$-type bottom region 120 serves to increase current conduction efficiency in the field transistor. In one aspect of the invention, the p$^+$-type bottom region 120 is not formed. In this aspect of the invention, an n-type substrate is used in place of the p-type substrate 110 and the p-type well region 130 is formed in the upper region of the n-type substrate. In this aspect of the invention, the p-type well region 130 may be formed by ion implantation and/or a drive-in diffusion process.

Figure 4:
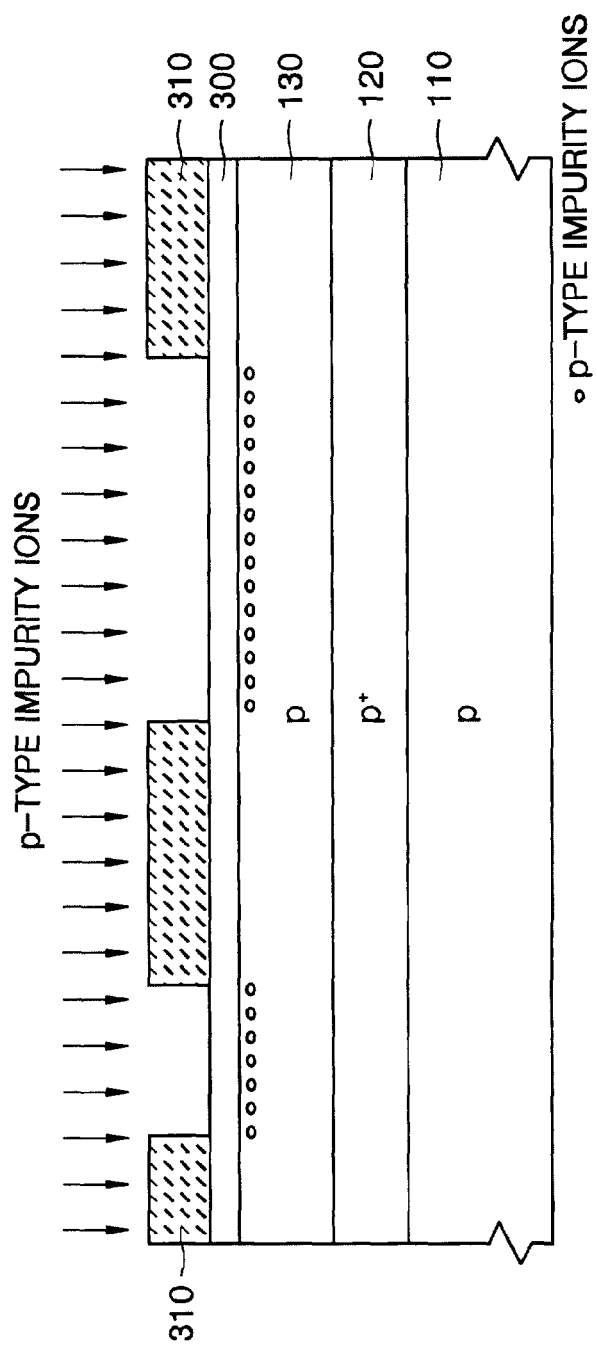

Next, as illustrated in FIG. 4, an oxide layer 300 and a nitride layer pattern 310 are sequentially formed on the p-type well region 130. Then, an ion implantation process is performed using the nitride layer pattern 310 as an ion implantation mask to partially implant p-type impurity ions into the top of the p-type well region 130.

Figure 5:
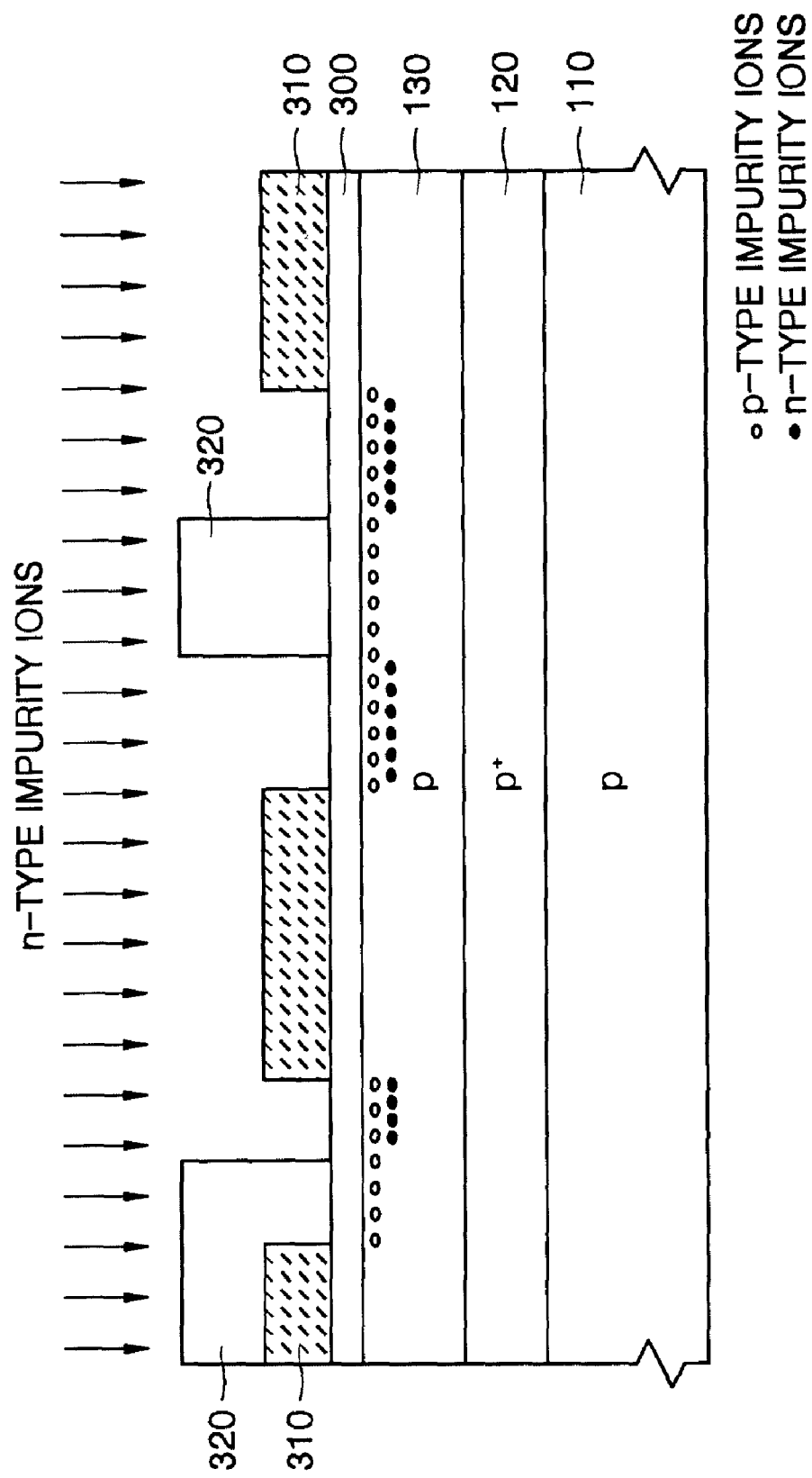

As depicted in FIG. 5, a mask layer pattern 320 is then formed to cover the desired parts of the nitride layer pattern 310 and the oxide layer 300. An ion implantation process is next performed using the mask layer pattern 320 as an ion implantation mask to partially implant n-type impurity ions into the top of the p-type well region 130. In one aspect of the invention, the implantation concentration of the n-type impurity ions is higher than that of the earlier-implanted p-type impurity ions.

As shown in FIG. 6, a thermal oxidation process is then performed using the nitride layer pattern 310 as an oxidation prevention layer, thereby forming field oxide layer 170. During the thermal oxidation process, a drive-in diffusion process is performed on the implanted p- and n-type impurity ions to form a p-type diffusion region 162, an n-type diffusion region 164, an n-type low concentration source region 145, a p-type region 135, and an n-type low concentration drain region 155. The nitride layer pattern 310 and the oxide layer 300 covered by the nitride layer pattern 310 are removed.

As shown in FIG. 7, any well-known ion implantation process using an ion implantation mask and a drive-in diffusion process are then employed to form a p$^+$-type diffusion region 160, an n$^+$-type source region 140, and an n$^+$-type drain region 150. The ion implantation process is separated into n-type impurity ion implantation and p-type impurity ion implantation, while the drive-in diffusion process is performed so that the n- and p-type impurity ions are simultaneously diffused.

Figure 8:
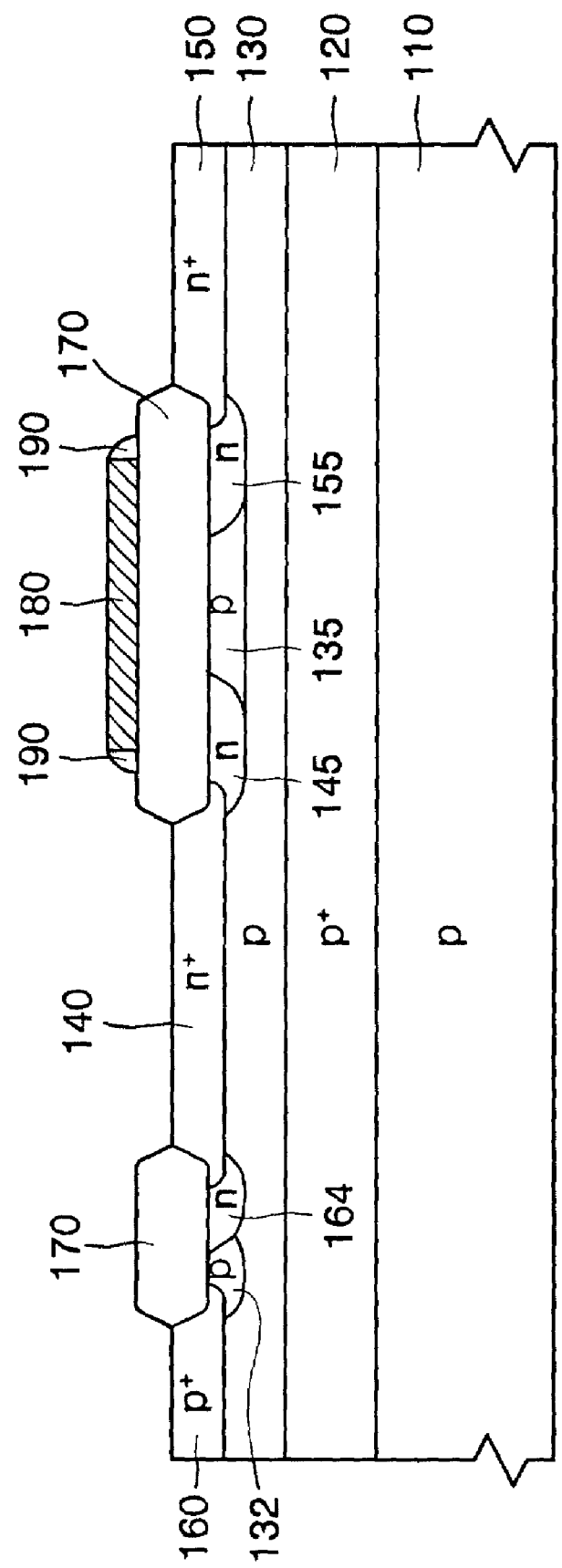

As illustrated in FIG. 8, a gate conductive layer such as a polysilicon layer is formed over the resulting structure of FIG. 7. Then the gate conductive layer is patterned to form a gate conductive layer pattern 180 remaining only on the field oxide layer 170, allowing the edges of the gate conductive layer pattern 180 to overlap the n-type low concentration source region 145 and the n-type low concentration drain region 155, respectively, with the field oxide layer 170 interposed therebetween. Next, a spacer 190 is formed on the sidewall of the gate conductive layer pattern 180.

Subsequently, an interlayer dielectric layer is formed over the resulting structure of FIG. 8. The interlayer dielectric layer is patterned to form the interlayer dielectric layer pattern 230 having openings which partially expose the surfaces of the p$^+$-type diffusion region 160, the n$^+$-type source region 140, and the n$^+$-type drain region 150. Then, as shown in FIG. 2 and known in the art, a metal layer is stacked in the openings to form a source electrode 210 contacting both p$^+$-type diffusion region 160 and n$^+$-type source region 140, a gate electrode 200 contacting the gate conductive layer pattern 180, and a drain electrode 220 contacting both n$^+$-type drain region 150 and gate electrode 200.

Figure 1:
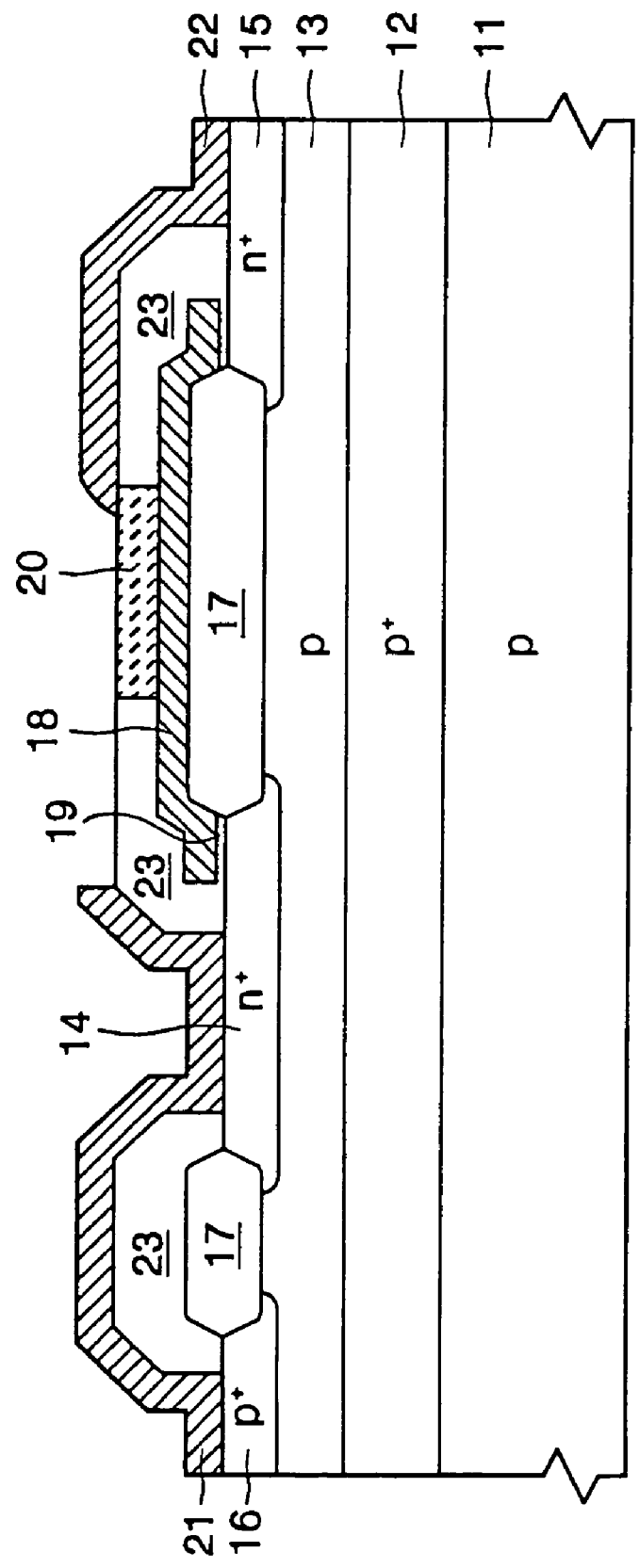

In the field transistor and manufacturing method according to the invention, since the entire gate conductive layer pattern 180 is formed only on the field oxide layer 170, there is no relatively thin gate insulating layer (such as layer 19 depicted in FIG. 1). Thus, insulation breakdown of the gate insulating layer due to a strong electric field from the outside is decreased or eliminated, thereby increasing the electrical reliability of the device. Further, the low concentration source/ drain regions 145 and 155 adjacent to the source/drain regions 140 and 150, respectively, are overlapped by the edges of the gate conductive layer pattern 180 with the field oxide layer 170 therebetween, forming a complete current path between a drain terminal and a bulk.

Having described the preferred aspects of the invention, it is understood that the invention defined by the appended claims is not to be limited by particular details set forth in the above description, as many apparent variations thereof are possible without departing from the spirit or scope thereof.

We claim:

1. A field transistor having a current path between a source and a drain while containing no thin gate insulating layer, the transistor comprising:
   a well region of a first conductivity type;
   a field oxide layer for defining an active region on the well region;
   high concentration source and drain regions of a second conductivity type separated from each other by a width of the field oxide layer;
   a low concentration source region of the second conductivity type formed in the well region, the low concentration source region being adjacent to the high concentration source region and overlapped by one end of the field oxide layer;
   a low concentration drain region of the second conductivity type formed in the well region, the low concentration drain region being adjacent to the high concentration drain region and overlapped by the other end of the field oxide layer; and
   a gate conductive layer pattern formed on the field oxide layer, the gate conductive layer pattern overlapping parts of the low concentration source and drain regions of the second conductivity type.

2. The field transistor of claim 1, wherein the well region of the first conductivity type is formed on a high concentration buried region of the first conductivity type on a semiconductor substrate of the first conductivity type.

3. The field transistor of claim 1, wherein the well region of the first conductivity type is formed on a semiconductor substrate of the first conductivity type.

4. The field transistor of claim 1, further comprising a high concentration diffusion region of the first conductivity type formed in the well region, the high concentration diffusion region being separated from the high concentration source region of the second conductive type by a predetermined distance.

5. The field transistor of claim 4, further comprising a low concentration diffusion region of the first conductivity type and a low concentration diffusion region of the second conductivity type, both low concentration diffusion regions being adjacent to each other between the high concentration diffusion region of the first conductivity type and the high concentration source region of the second conductivity type.

6. The field transistor of claim 5, wherein the low concentration diffusion region of the first conductivity type is adjacent to the high concentration diffusion region of the first conductivity type, and the low concentration diffusion region of the second conductivity type is adjacent to the high concentration source region of the second conductivity type.

7. The field transistor of claim 1, further comprising:
   a gate electrode electrically connected to the gate conductive layer pattern;
   a source electrode electrically connected to the high concentration source region of the second conductivity type; and
   a drain electrode electrically connected to the high concentration drain region of the second conductivity type.

8. The field transistor of claim 7, wherein the drain electrode is electrically connected to the gate electrode.

9. The field transistor of claim 7, wherein the source electrode is electrically connected to the high concentration diffusion region of the first conductivity type as well.

10. The field transistor of claim 1, wherein the first conductivity type is p-type, and the second conductivity type is n-type.

11. A semiconductor device having a current path between a source and a drain while containing no thin gate insulating layer, the transistor comprising:
    a substrate comprising a well region of a first conductivity type;
    a field oxide layer located over a portion of the well region;
    a first source region of a second conductivity type and a first drain region of a second conductivity type separated by the field oxide layer;
    a second source region having a second conductivity type concentration lower than the first source region, the second source region formed in the well region adjacent the first source region with a portion of the second source region underlying the field oxide layer;
    a second drain region having a second conductivity type concentration lower than the first drain region, the second drain region formed in the well region adjacent the first drain region with a portion of the second drain region underlying the field oxide layer, and
    a conductive layer formed over the field oxide layer, the conductive layer overlapping the second source region and the second drain region.

12. The device of claim 11, further comprising a first diffusion region of the first conductivity type formed in the well region and separated from the first source region.

13. The device of claim 12, further comprising a second diffusion region having a first conductivity type concentration lower than the first diffusion region and comprising a third diffusion region of the second conductivity type, both the second and third diffusion regions adjacent each other and located between the first diffusion region and the first source region.

14. The device of claim 13, the second diffusion region type located adjacent the first diffusion region and the third diffusion region located adjacent the first source region.

15. The device of claim 11, further comprising:
    a gate electrode electrically connected to the conductive layer;
    a source electrode electrically connected to the first source region; and
    a drain electrode electrically connected to the first drain region.

16. The device of claim 15, the drain electrode being electrically connected to the gate electrode.

17. The device of claim 15, the source electrode being electrically connected to the first diffusion region.

18. The device of claim 11, wherein the first conductivity type is p-type and the second conductivity type is n-type.

19. A semiconductor device having a current path between a source and a drain while containing no thin gate insulating layer, the transistor comprising:
    a substrate comprising a well region of a first conductivity type;
    a field oxide layer located over the well region;
    a first source region of a second conductivity type and a first drain region of a second conductivity type separated by the field oxide layer;

a second source region having a second conductivity type concentration lower than the first source region, the second source region formed in the well region adjacent the first source region with a portion of the second source region underlying the field oxide layer, a second drain region having a second conductivity type concentration lower than the first drain region, the second drain region formed in the well region adjacent the first drain region with a portion of the second drain region underlying the field oxide layer, a conductive layer formed over the field oxide layer, the conductive layer overlapping the second source region and the second drain region;

a gate electrode electrically connected to the conductive layer;

a source electrode electrically connected to the first source region; and a drain electrode electrically connected to the first drain region.

20. The device of claim 19, further comprising a first diffusion region of the first conductivity type formed in the well region and separated from the first source region, a second diffusion region having a first conductivity type concentration lower than the first diffusion region, and a third diffusion region of the second conductivity type, wherein both the second and third diffusion regions are adjacent each other and located between the first diffusion region and the first source region.

21. A system for electrostatic discharge protection containing a field transistor having a current path between a source and a drain without a thin gate insulating layer, the field transistor comprising:

a substrate comprising a well region of a first conductivity type;

a field oxide layer located over the well region;

a first source region of a second conductivity type and a first drain region of a second conductivity type separated by the field oxide layer;

a second source region having a second conductivity type concentration lower than the first source region, the second source region formed in the well region adjacent the first source region with a portion of the second source region underlying the field oxide layer, a second drain region having a second conductivity type concentration lower than the first drain region, the second drain region formed in the well region adjacent the first drain region with a portion of the second drain region underlying the field oxide layer, and a conductive layer formed over the field oxide layer, the conductive layer overlapping the second source region and the second drain region.

22. A semiconductor device for electrostatic discharge protection, the device comprising a field transistor having both a source region and a drain region overlapped by a gate conductive layer and having a current path between the source region and the drain region while containing no thin gate insulating layer.

23. A system for electrostatic discharge protection, the system comprising a field transistor having both a source region and a drain region overlapped by a gate conductive layer and having a current path between the source region and the drain region while containing no thin gate insulating layer.

* * * * *